United States Patent [19]

Rybicki

[11] Patent Number: 4,943,784

[45] Date of Patent: Jul. 24, 1990

[54] FREQUENCY STABLE DIGITALLY CONTROLLED DRIVER CIRCUIT

[75] Inventor: Mathew A. Rybicki, Austin, Tex.

[73] Assignee: Motorola, Inc., Schaumburg, Ill.

[21] Appl. No.: 319,002

[22] Filed: Mar. 6, 1989

[51] Int. Cl.[5] .......................... H03F 3/26; H03F 3/16
[52] U.S. Cl. .................................. 330/264; 330/277
[58] Field of Search .................. 307/497; 330/51, 255, 330/263, 264, 267, 269, 277, 307, 311

[56] References Cited

U.S. PATENT DOCUMENTS 3,947,727  3/1976  Stewart .......................... 330/264 X Primary Examiner—Steven Mottola
Attorney, Agent, or Firm—Paul J. Polansky

[57] ABSTRACT

A stable digitally controlled driver circuit having an output stage with two series-coupled transistors of opposite conductivity type. The driver circuit operates as an analog amplifier with a digitally controlled output stage. The digital control is provided by control transistors which selectively alternately couple a gate of each transistor in the output stage to the output of a differential amplifier. An output signal of the driver circuit is fed back to the input of the differential amplifier to provide a voltage gain determined by the feedback configuration. When both of the series-coupled transistors in the output stage are made nonconductive, the driver circuit's output is in a high impedance state thereby providing a three-state output.

10 Claims, 2 Drawing Sheets 4,943,784

FREQUENCY STABLE DIGITALLY CONTROLLED DRIVER CIRCUIT

Field of the Invention

This invention relates generally to the field of electronic circuits, and more particularly, to analog line driver circuits for use primarily with digital-to-analog converters.

BACKGROUND OF THE INVENTION

Digital-to-analog (D/A) converters are found in a wide variety of electronic circuit applications. An analog output of a D/A converter is used by analog circuitry which requires a predetermined amount of analog signal strength to operate. However, most D/A converters do not have the ability to provide a sufficiently strong analog output signal to be used by conventional analog circuits. Therefore, driver circuits which drive low impedance outputs, also known as line drivers, are used with D/A converters to drive the output of the D/A converter to a signal level which is sufficient to be used by other analog circuits. The line driver must be able to drive low impedance loads without degrading stability. It would be desirable for it to operate from low supply voltages, use little quiescent current, and layout in a small area.

Existing analog output stages for line drivers which are noted in an article "MOS Op Amp Design - An Overview" by Gray and Meyer in *IEEE Journal of Solid-State Circuits*, Vol SC-17, No. 6, Dec. 1982, pp. 969-982, have several disadvantages. One of these disadvantages is frequency instability resulting from a multiple pole characteristic. This feature which exists in many analog line drivers can cause the driver to inadvertently oscillate at certain frequencies. The stability of the driver varies due to random fluctuations in the manufacturing process of the integrated circuit. Because of processing fluctuations, the circuit's poles may need to be compensated for with additional components in the circuit, adding complexity and cost. In addition, when the output of a line driver is near the signal ground reference, either output node feedback to the last transistor stage or transistor threshold voltage mismatch or both may cause significant quiescent currents in known driver circuits. Since quiescent currents exist while the circuit is in a standby mode, significant unwanted power dissipation occurs.

BRIEF DESCRIPTION OF THE INVENTION

Accordingly, it is an object of the present invention to provide an improved frequency stable line driver.

Another object of the present invention is to provide an improved method of controlling operation of a line driver.

Yet another object of the present invention is to provide an improved line driver using digital control signals to avoid multiple-pole response characteristics existing in known line drivers.

In carrying out these and other objects of the invention, there is provided, in one form, a digitally controlled line driver circuit. The line driver circuit contains an output stage having two transistors of opposite conductivity. The two transistors are coupled in series between two power supply voltage terminals and provide an output signal. Switches make the first and second transistors alternately conductive in response to two control signals coupled to the switches. A control electrode of each transistor is alternately coupled between a predetermined power supply voltage terminal and an input of the line driver. The output signal may be fed back into the input of the line driver to establish, in part, a gain factor of the driver. In one form, the line driver may be coupled to the output of a digital-to-analog converter, and the sign bit of the converter and a complement thereof, used as the two control signals.

These and other objects, features and advantages will be more clearly understood from the following detailed description taken in conjunction with the accompanying drawings.

DETAILED DESCRIPTION OF THE INVENTION

Figure 1:
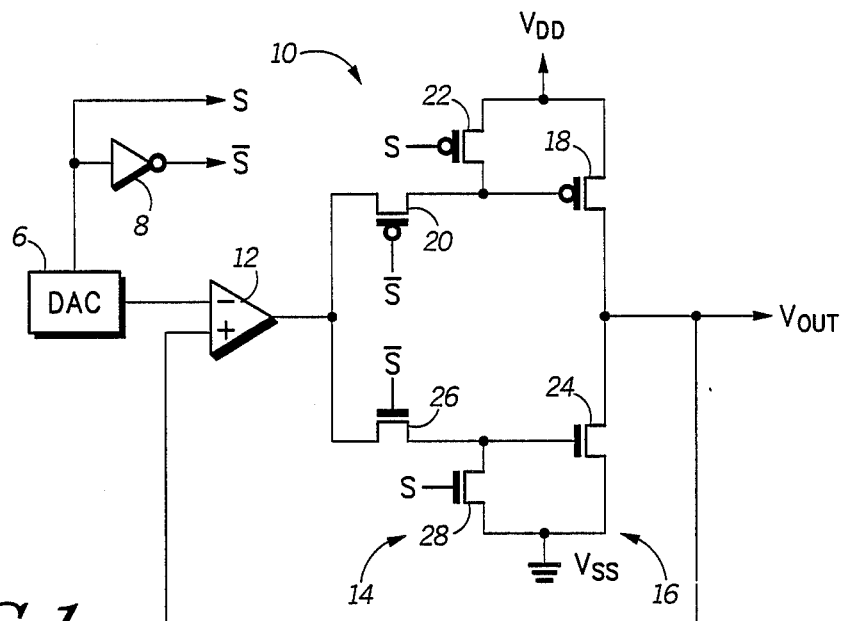
FIG. 1 illustrates in partial schematic form a line driver in accordance with the present invention.

Shown in FIG. 1 is a digital line driver 10 in accordance with the present invention. Line driver 10, in one form, may be used with a digital-to-analog converter (DAC)6. In general, line driver 10 comprises a differential amplifier 12, a control section 14, and an output stage 16. DAC 6 receives a digital input signal (not shown) and converts the digital signal into an equivalent analog signal. DAC 6 supplies two control signals, S and S inverted, where the control signal S inverted is provided by an inverter 8. In a preferred form, control signal S is a sign bit associated with the digital value being converted by DAC 6. An analog output of DAC 6 is connected to a positive, or noninverting, input of a differential amplifier 12. Differential amplifier 12 also has a negative, or inverting, input and an output.

Control section 14 comprises a P-channel transistor 20 having a source connected to the output of differential amplifier 12, a control electrode coupled to the S inverter control signal, and a drain connected to a drain of a P-channel transistor 22. A gate of transistor 22 is connected to the S control signal, and a source of transistor 22 is connected to a positive power supply voltage, labeled $V_{DD}$. An N-channel transistor 26 has a drain connected to the output of differential amplifier 12, a gate connected to the S inverted control signal, and a source connected to a drain of an N-channel transistor 28. A gate of transistor 28 is connected to the S control signal, and a source of transistor 28 is connected to a power supply voltage, labeled $V_{SS}$. In the illustrated form, power supply voltage $V_{DD}$ is more positive than power supply voltage $V_{SS}$.

Output stage 16 comprises a P-channel transistor 18 having a source connected to power supply voltage $V_{DD}$, a gate connected to the drain of transistor 20, and a drain for providing an output signal labeled $V_{OUT}$ at an output terminal. An N-channel transistor 24 has a drain connected to the source of transistor 18, a gate connected to the source of transistor 26, and a source connected to power supply voltage $V_{SS}$. While the embodiment described herein contains MOS transistor of specific conductivity, other types of transistors and conductivity may be used.

In operation, line driver 10 uses digital control inputs S and S inverted to control how the output of DAC 6 is driven onto the driver output terminal. A converted analog voltage supplied by DAC 6 is the signal to be amplified by line driver 10 and outputted as the output signal $V_{OUT}$. The output from DAC 6 may be amplified by line driver 10. The amplification factor of line driver 10 is determined by the feedback employed. In the illustrated form of FIG. 1, the output terminal of line driver 10 is connected directly to the positive input of differential amplifier 12 in a unity gain configuration. Therefore, in FIG. 1 the output of differential amplifier 12 is proportional to a difference between the output voltage of line driver 10 and the output voltage of DAC 6. The output of amplifier 12 is positive with respect to the input polarities of amplifier 12 shown in FIG. 1. The output of differential amplifier 12 is coupled to the output stage 16 through control section 14 and is used to drive one of the output transistors 18 or 24. Which one of transistors 18 or 24 is driven by the output of differential amplifier 12 is controlled by control section 14 and is determined by the logic value of control signals S and S inverted. In the illustrated form, the S and S inverted control signals are digital inputs which have a value of substantially $V_{DD}$ and $V_{SS}$, respectively.

When the control signal S inverted is a logic high, control transistor 20 is turned off, and the control signal S turns on transistor 22 which functions as a pull-up transistor to raise the voltage of the gate of transistor 18 to $V_{DD}$. When transistor 22 is turned on, the voltage on the gate of transistor 18 turns transistor 18 off. Conversely, when the control signal S inverted is at $V_{SS}$, transistor 20 is conducting and the output of the differential amplifier 12 is coupled to the gate of transistor 18 of output stage 16. The control signal S is at $V_{DD}$, which disables the pull-up transistor 22.

Similarly, when control signal S inverted is at $V_{SS}$ the control transistor 26 is turned off, and the control signal S turns on transistor 28 which functions as a pull-down transistor. When transistor 28 is turned on, the voltage on the gate of the output transistor 24 is at $V_{SS}$ which turns transistor 24 off. Conversely, when control signal S inverted is at $V_{DD}$, the control transistor 26 is conducting and the output of the differential amplifier 12 is driven onto the gate of output transistor 24. Control signal S is at $V_{SS}$, which disables the pull-down transistor 28 thereby decoupling $V_{SS}$ from the gate of transistor 24.

In another form, instead of using the same control signals S and S inverted for respectively controlling transistors 22, 28 and transistors 20, 26, different control signals (not shown) may be used for the transistor pairs 20, 22 and 26, 28. The different control signals which are applied to the gates of transistors 20, 22, 26 and 28 have a logic level which decouples the gates of transistors 18 and 24 from the output of amplifier 12, couples them to their respective supplies, and places output signal $V_{OUT}$ in a high impedance state which may be desirable for some output applications. The high impedance state allows driver 10 to have three output states and is a circuit feature conventionally known as "three-stated". While the embodiment here shows amplifier 10 as a single-ended amplifier, it should be readily apparent that this circuitry may be used within a fully differential architecture.

Figure 2A:
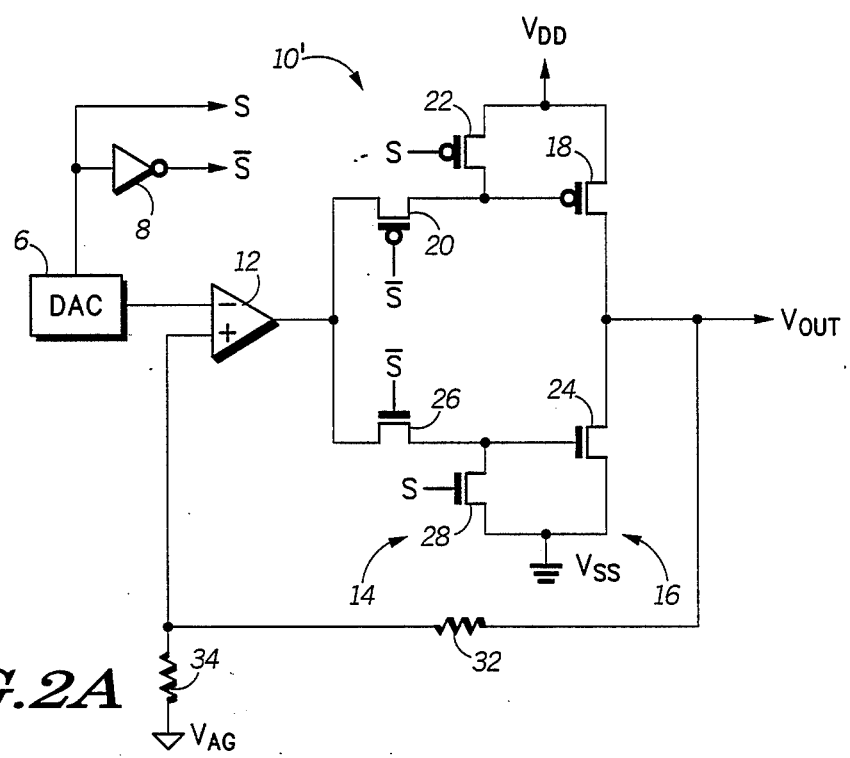
FIGS. 2(A) and 2(B) illustrate in partial schematic form other embodiments of the present invention.

Shown in FIG. 2A is a noninverting configuration 10' of line driver 10 of FIG. 1. For convenience of illustration, elements common in FIG. 2A to line driver 10 of FIG. 1 are similarly numbered. A resistor 32 has a first terminal connected to the output signal at the drain of transistor 18, and has a second terminal connected to the negative input of differential amplifier 12. A resistor 34 has a first terminal connected to the negative input of differential amplifier 12, and a second terminal connected to a signal reference voltage $V_{AG}$. The voltage gain of line driver 10' of FIG. 2A is substantially proportional to a ratio of the resistive values of resistors 32 and 34.

Figure 2B:
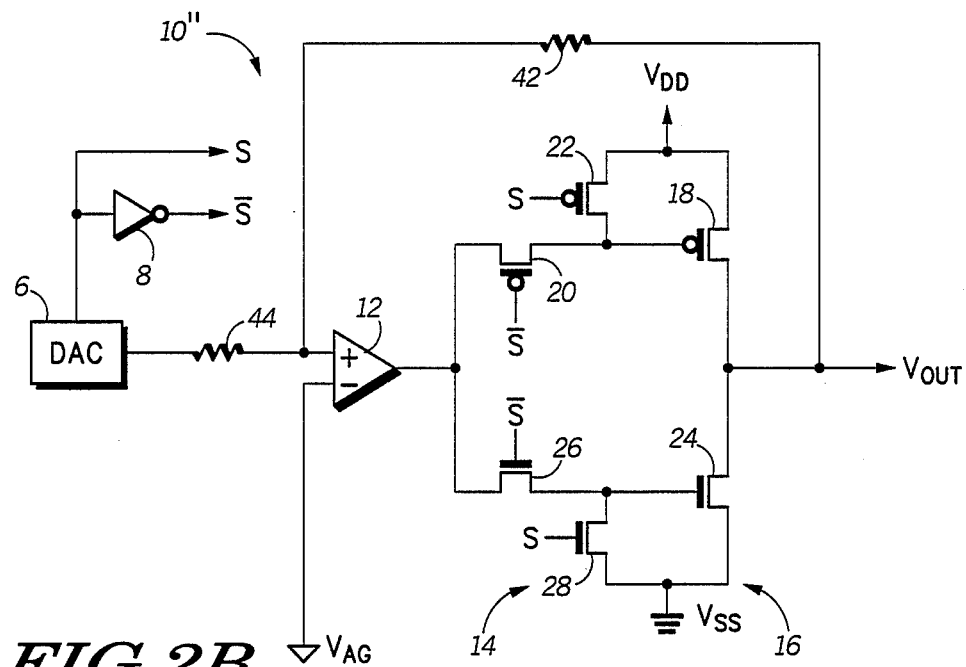

Shown in FIG. 2B is an inverting configuration 10" of line driver 10 of FIG. 1. Again, for convenience of illustration, elements common in FIG. 2B to line driver 10 of FIG. 1 are similarly numbered. A resistor 42 has a first terminal connected to the output signal at the drain of transistor 18, and has a second terminal connected to the positive input of differential amplifier 12. A resistor 44 has a first terminal connected to the output of DAC 6, and has a second terminal connected to the negative input of differential amplifer 12. The positive input of differential amplifier 12 is connected to the signal reference voltage $V_{AG}$. The output signal $V_{OUT}$ in the noninverting configuration is proportional to a ratio of the resistive value of resistors 42 and 44.

In operation, the input signal provided by DAC 6 is coupled through differential amplifier 12 to selectively drive output stage 16 in response to the control signals. In the illustrated form, the control signals are sign bits provided by DAC 6. The digital control of line driver 10, and variations thereof, which is provided by the sign bit control signal eliminates circuitry which could create frequency domain poles or zeros and thereby simplifies frequency compensation of the driver. In addition, the digital control of line driver 10 eliminates output quiescent currents associated with standard output stage designs, and associated variations allow the circuit to be placed into a three-sate condition by simple control signal logic.

Figure 3:
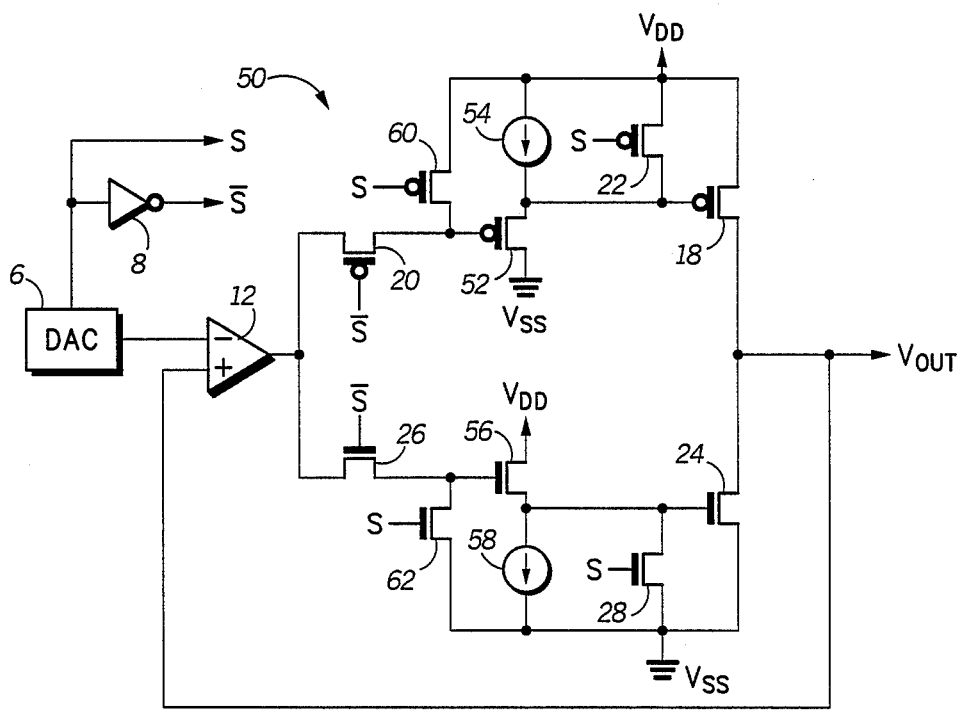
FIG. 3 illustrates in partial schematic form yet another embodiment of the present invention.

Shown in FIG. 3 is a line driver 50 in accordance with the present invention and having source follower circuitry. Again, elements which are common between line driver 50 and line driver 10 of FIG. 1 are similarly numbered for convenience of illustration. In the modified form, the drain of transistor 20 is connected to a gate of a P-channel transistor 52. A drain of transistor 52 is connected to power supply voltage $V_{SS}$. A first terminal of a currrent source 54 is connected to power supply voltage $V_{DD}$, and a second terminal of current source 54 is connected to both a source of transistor 52 and to the gate of transistor 18. The gate of transistor 52 is also connected to the drain of a P-channel transistor 60. The source of transistor 60 is connected to power supply voltage $V_{DD}$, and the gate of transistor 60 is connected to the control signal S. The source of transistor 26 is connected to a gate of an N-channel transistor 56. A drain of transistor 56 is connected to power supply voltage $V_{DD}$, and a source of transistor 56 is connected to both a first terminal of a current sink 58 and to the gate of transistor 24. A second terminal of current sink 58 is connected to power supply voltage $V_{SS}$. The gate of transistor 56 is also connected to the drain of an N-channel transistor 62. The source of transistor 62 is connected to power supply voltage $V_{SS}$, and the gate of transistor 62 is connected to the control signal S.

In operation, the source followers formed by current source 54 and transistor 52 and by current sink 58 and transistor 56 each implement a level shifting and buffering function. Current source 54 and transistor 52 create a transistor gate-to-source voltage rise between the drain of transistor 20 and the gate of transistor 18 when transistor 20 is turned "on". Similarly, current sink 58 and transistor 56 create a transistor gate-to-source voltage drop between the source of transistor 26 and the gate of transistor 24 when transistor 26 is "on". Each gate-to-source voltage drop reduces the need for differential amplifier 12 to provide wide voltage siwngs to drive transistors 18 and 24. When control signal S inverted turns off transistor 20 and disconnects the gate of transistor 52 from the output of amplifier 12, control signal S turns on transistor 60 and ensures that the gate of transistor 52 is not floating by biasing transistor 52 off. Similarly, when control signal S inverted turns off transistor 26 and disconnects the gate of transistor 56 from the output of amplifier 12, control signal S turns on transistor 62 and ensures that the gate of transistor 56 is not floating by biasing transistor 56 off. Large slew limited voltage swings may produce voltage transients in line driver 10 of FIG. 1. Specifically, at the instant control transistor 20 becomes conductive and transistor 22 and transistor 60 become nonconductive, transistor 52 buffers output transistor 18 and the output of amplifier 12 must slew the difference between the gate to source voltage of transistor 18 plus the gate to source voltage of transistor 52 below $V_{DD}$, and the gate to source voltage of transistor 24 plus the gate to source voltage of transistor 56 above $V_{SS}$. Similarly, at the instant control transistor 26 becomes conductive and transistor 28 becomes nonconductive, transistor 56 buffers output transistor 24 and slews the difference between the gate to source voltage of transistor 24 plus the gate to source voltage of transistor 56 above $V_{SS}$, and the gate to source voltage of transistor 18 plus the gate to source voltage of transistor 52 below $V_{DD}$. Without the source follower circuitry of FIG. 3 as in FIG. 1, the voltage swing required from the output of differential amplifier 12 is approximately the difference between $V_{DD}$ less the gate to source voltage of the output transistor 18 and $V_{SS}$ plus the gate to source voltage of output transistor 24. However with the addition of the source follower circuitry, the voltage swing required from the differential amplifier 12 to drive the output transistors is reduced by a transistor gate-to-source threshold voltage for each of output transistors 18 and 24. Transistors 22 and 28 decrease the time it takes transistors 18 and 24, respectively, to turn off, but may be omitted.

Any known or unknown feedback configuration may be applied between the output stage 16 and the positive and negative inputs of amplifier 12, such as switched capacitors, which differs from the resistive feedback described herein. By now it should be apparent that an analog line driver has been provided which is digitally controlled by control transistors to avoid additional circuitry which typically creates frequency instability. By digitally controlling an analog line driver, fewer unwanted frequency domain poles and/or zeros are introduced into the circuit. Also, through digital control, quiescent currents are eliminated in the output stage, a common problem in low-impedance drivers. When the line driver is utilized with a digital-to-analog converter, the sign bit of the analog converter may be used to control the line driver, thereby eliminating additional control logic. The line driver may be easily made to have a three-state output without adding additional devices to the driver. Additionally, source follower circuitry may be used in applications where the magnitude of voltage transients is especially important to limit. Any known or to-be-known feedback connections could be used.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A digitally controlled driver circuit comprising:
   an output stage having first and second transistors coupled in series between first and second power supply voltage terminals and providing an output signal;
   control means coupled to the output stage, said control means making the first and second transistor alternately conductive in response to at least one control signal coupled to the control means; and
   means coupled to the output stage and the control means for providing a negative feedback path from the output signal to an input of the control means for use in alternately making the first and second transistors conductive and for controlling a gain of the driver circuit.

2. The digitally controlled driver circuit of claim 1 wherein said control means selectively make both the first and second transistors nonconductive, thereby providing the output signal as a high impedance output signal.

3. The digitally controlled driver circuit of claim 1 wherein said control means also limits drive voltage levels required at the input of the control means to make the first and second transistors conductive.

4. The digitally controlled driver circuit of claim 1 wherein said first and second transistors have opposite conductivity types.

5. A digitally controlled driver circuit comprising:
   an output stage having first and second transistors coupled in series between first and second power supply voltage terminals and providing an output signal;
   switching means coupled to the output stage, said switching means having an input for receiving a signal voltage, said switching means selectively making the first transistor nonconductive and coupling a control electrode of the second transistor to the signal voltage or making the second transistor nonconductive and coupling a control electrode of the first transistor to the signal voltage; and
   means coupled to the switching means and output stage for providing the signal voltage to the switching means, said signal voltage having a magnitude determined, in part, by a difference between a portion of the output signal and an input signal received by said means.

6. The digitally controlled driver circuit of claim 5 wherein said first and second transistors are respectively a P-channel MOS transistor and an N-channel MOS transistor.

7. The digitally controlled driver circuit of claim 5 wherein said switching means further comprise:
   a third transistor having a first current electrode coupled to a first power supply voltage terminal, a control electrode for receiving a first control signal, and a second current electrode coupled to a control electrode of the first transistor;

a fourth transistor having a first current electrode coupled to the second current electrode of the third transistor, a control electrode for receiving a second control signal, and a second current electrode coupled to the signal voltage;

a fifth transistor having a first current electrode coupled to the second current electrode of the fourth transistor, a control electrode for receiving the second control signal, and a second current electrode coupled to a control electrode of the second transistor; and a sixth transistor having a first current electrode coupled to the second current electrode of the fifth transistor, a control electrode for receiving the first control signal, and a second current electrode coupled to a second power supply voltage terminal.

8. The digitally controlled driver circuit of claim 5 wherein said switching means further comprise:

a third transistor having a first current electrode coupled to the first power supply voltage terminal, a control electrode for receiving a first control signal, and a second current electrode;

a current source having a first terminal coupled to the first power supply voltage terminal, and a second terminal;

a fourth transistor having a first current electrode coupled to both the second terminal of the current source and the control electrode of the first transistor, a control electrode coupled to the second current electrode of the third transistor, and a second current electrode coupled to a second power supply voltage terminal;

a fifth transistor having a first current electrode coupled to both the control electrode of the fourth transistor and the second current electrode of the third transistor, a control electrode for receiving a second control signal, and a second current electrode coupled to the signal voltage;

a sixth transistor having a first current electrode coupled to the second current electrode of the fifth transistor, a control electrode for receiving the second control signal, and a second current electrode;

a seventh transistor having a first current electrode coupled to the second current electrode of the sixth transistor, a control electrode coupled to the first control signal, and a second current electrode coupled to the second power supply voltage terminal;

an eighth transistor having a first current electrode coupled to the first power supply voltage terminal, a control electrode coupled to the second current electrode of the sixth transistor, and a second current electrode coupled to the control electrode of the second transistor; and a current sink having a first terminal coupled to the second current electrode of the eighth transistor, and a second terminal coupled to the second power supply voltage terminal.

9. A method of digitally controlling a driver circuit for buffering an input signal, comprising the steps of:

coupling between two power supply voltage terminals first and second transistors in series at a node to provide an output signal at the node;

either, making the first transistor nonconductive and coupling a control electrode of the second transistor to a signal voltage, or making the second transistor nonconductive and coupling a control electrode of the first transistor to the signal voltage in response to at least one digital control signal having one of two signal logic levels;

coupling negative feedback from the output signal to establish a gain of the driver circuit; and providing the signal voltage for selectively driving the first and second transistors by using a differential of the negative feedback from the output signal and the input signal.

10. The digitally controlled driver circuit of claim 5, wherein said switching means makes the first transistor nonconductive and couples the control electrode of the second transistor to the signal voltage in response to a control signal, and wherein said switching means makes the second transistor nonconductive and couples the control electrode of the first transistor in response to a complement of said control signal, wherein said control signal represents a polarity of the input signal.

* * * * *